US010483178B2

(12) United States Patent
Manjappaiah et al.

(10) Patent No.: US 10,483,178 B2
(45) Date of Patent: Nov. 19, 2019

(54) SEMICONDUCTOR DEVICE INCLUDING AN ENCAPSULATION MATERIAL DEFINING NOTCHES

(71) Applicant: Infineon Technologies AG, Neubiberg (DE)

(72) Inventors: Upendra Balehithlu Manjappaiah, Singapore (SG); Kok Kiat Koo, Singapore (SG); Khai Seen Yong, Johor (MY)

(73) Assignee: Infineon Technologies AG, Neubiberg (DE)

( * ) Notice: Subject to any disclaimer, the term of this patent is extended or adjusted under 35 U.S.C. 154(b) by 19 days.

(21) Appl. No.: 15/397,270

(22) Filed: Jan. 3, 2017

(65) Prior Publication Data

US 2018/0190557 A1 Jul. 5, 2018

(51) Int. Cl.
*H01L 23/31* (2006.01)
*H01L 23/28* (2006.01)
*H01L 21/48* (2006.01)
*H01L 23/495* (2006.01)

(52) U.S. Cl.
CPC .......... *H01L 23/28* (2013.01); *H01L 21/4853* (2013.01); *H01L 23/31* (2013.01); *H01L 23/3107* (2013.01); *H01L 23/49555* (2013.01); *H01L 2224/48091* (2013.01); *H01L 2224/48247* (2013.01); *H01L 2224/73265* (2013.01); *H01L 2924/1815* (2013.01)

(58) Field of Classification Search
CPC ..... H01L 23/28; H01L 23/31; H01L 23/3114; H01L 21/4853; H01L 21/563; H01L 23/3107
See application file for complete search history.

(56) References Cited

U.S. PATENT DOCUMENTS 6,362,517 B1   3/2002   Bell et al.
8,648,456 B1   2/2014   Mahler et al.
(Continued)

FOREIGN PATENT DOCUMENTS

JP   2002-329815   11/2002

OTHER PUBLICATIONS

Y. Liu, Power Package Electrical Isolation Design, Chapter 2, Power Electronic Packaging: Design, Assembly Process, 2012.
(Continued)

*Primary Examiner* — Joseph C. Nicely
(74) *Attorney, Agent, or Firm* — Dicke, Billig & Czaja, PLLC (57) ABSTRACT

A semiconductor device includes a first contact element, a second contact element, a semiconductor chip, and an encapsulation material. The first contact element is on a first side of the semiconductor device. The second contact element is on a second side of the semiconductor device opposite to the first side. The semiconductor chip is electrically coupled to the first contact element and the second contact element. The encapsulation material encapsulates the semiconductor chip and portions of the first contact element and the second contact element. The encapsulation material defines at least two notches on a third side of the semiconductor device extending between the first side and the second side.

18 Claims, 10 Drawing Sheets

(56) References Cited

U.S. PATENT DOCUMENTS

| | | | |
|---|---|---|---|
| 2007/0052072 A1* | 3/2007 | Iwade | H01L 23/051 |
| | | | 257/675 |
| 2007/0181984 A1 | 8/2007 | Son et al. | |
| 2009/0230519 A1* | 9/2009 | Otremba | H01L 23/49524 |
| | | | 257/666 |
| 2012/0326289 A1* | 12/2012 | Minamio | H01L 21/565 |
| | | | 257/676 |
| 2013/0140685 A1* | 6/2013 | Heinrich | H01L 23/49513 |
| | | | 257/666 |
| 2014/0077345 A1* | 3/2014 | Uno | H01L 23/3135 |
| | | | 257/664 |
| 2014/0197551 A1* | 7/2014 | Porwol | H01L 21/56 |
| | | | 257/787 |
| 2016/0315037 A1 | 10/2016 | Kadoguchi et al. | |
| 2017/0040239 A1* | 2/2017 | Glenn | H01L 23/49562 |
| 2017/0330824 A1* | 11/2017 | Tabata | H01L 23/495 |

OTHER PUBLICATIONS

Clearance and Creepage Rules for PCB Assembly, Optimum Design Associates, Clearance and Creepage Rules for PCB Assembly, Mar. 2014.

* cited by examiner

SEMICONDUCTOR DEVICE INCLUDING AN ENCAPSULATION MATERIAL DEFINING NOTCHES

BACKGROUND

For semiconductor device packages, creepage is defined as the shortest distance on the surface of an insulating material between two conductive elements. As the working voltage of a semiconductor device increases, the minimum creepage distance also increases.

For these and other reasons, there is a need for the present invention.

SUMMARY

One example of a semiconductor device includes a first contact element, a second contact element, a semiconductor chip, and an encapsulation material. The first contact element is on a first side of the semiconductor device. The second contact element is on a second side of the semiconductor device opposite to the first side. The semiconductor chip is electrically coupled to the first contact element and the second contact element. The encapsulation material encapsulates the semiconductor chip and portions of the first contact element and the second contact element. The encapsulation material defines at least two notches on a third side of the semiconductor device extending between the first side and the second side.

DETAILED DESCRIPTION

In the following Detailed Description, reference is made to the accompanying drawings, which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various examples described herein may be combined with each other, unless specifically noted otherwise.

As used herein, the term "electrically coupled" is not meant to mean that the elements must be directly coupled together and intervening elements may be provided between the "electrically coupled" elements.

Due to voltage requirements, a minimum creeepage distance may be required between the corner leads of a semiconductor device package. To obtain the required creepage distance, the length of the semiconductor device package may be increased and/or the width of tie bars may be reduced. Shorter semiconductor device package lengths, however, are desired to increase usability and reduce costs.

Accordingly, examples of the semiconductor device packages disclosed herein have an increased package circumference, which provides the required creepage distance without increasing the length of the semiconductor device packages. The package circumference is increased by forming notches (i.e., undercuts) along the package length between the corner leads of the package.

Figure 1A:
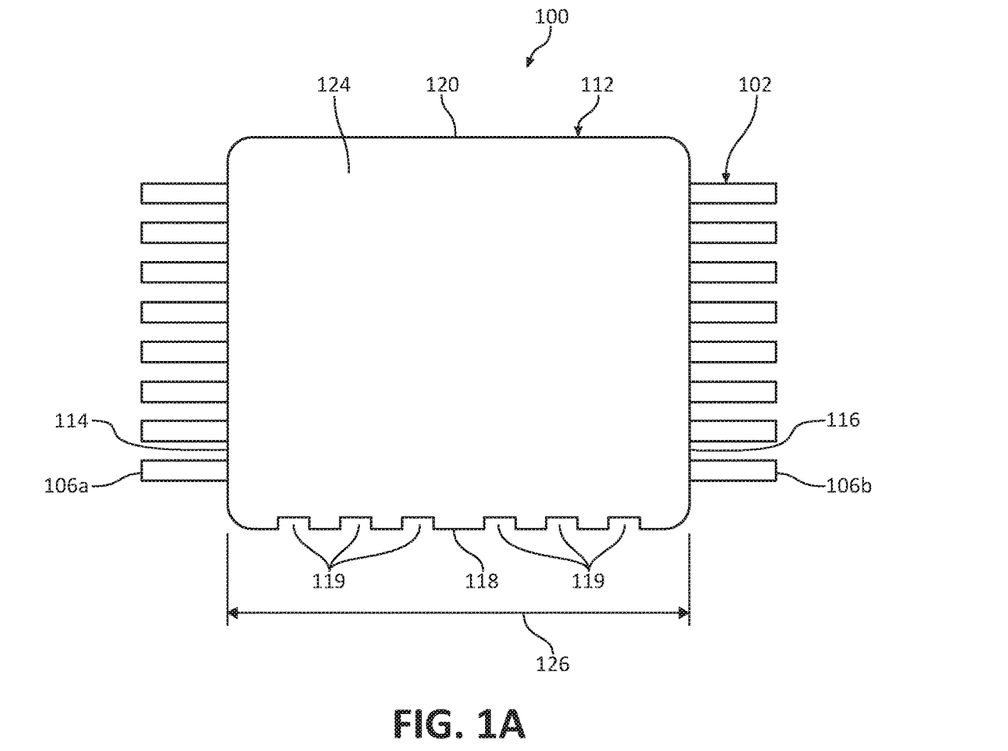
FIGS. 1A and 1B illustrate one example of a semiconductor device including notches for increasing a creepage distance.
Figure 1B:
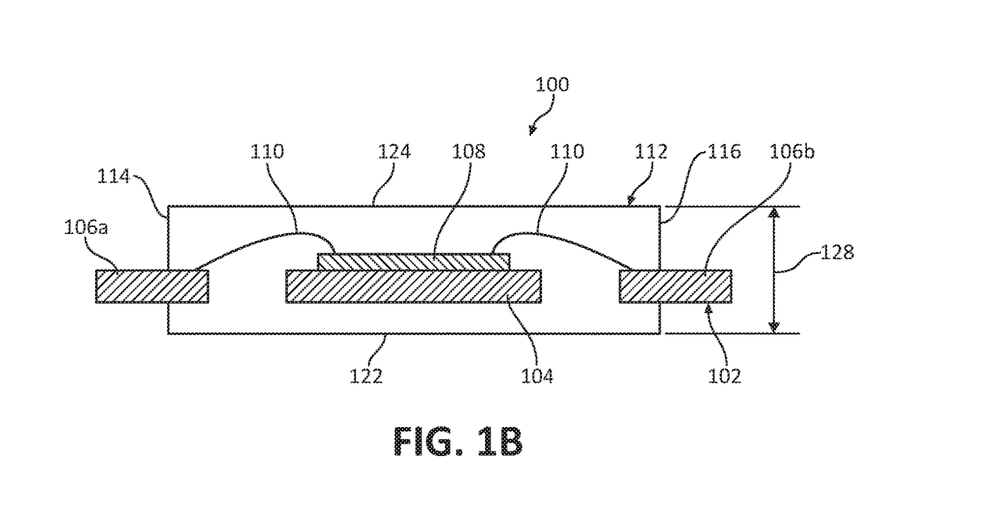

FIG. 1A illustrates a top view and FIG. 1B illustrates a cross-sectional view of one example of a semiconductor device 100 including notches for increasing a creepage distance. Semiconductor device 100 includes a lead frame 102, a semiconductor chip 108, bond wires 110, and encapsulation material 112. Lead frame 102 includes a die pad 104, a plurality of first leads (i.e., contact elements) including a first lead 106a on a first side of the lead frame and a plurality of second leads including a second lead 106b on a second side of the lead frame opposite to the first side of the lead frame. Semiconductor chip 108 is attached to die pad 104 and electrically coupled to the leads including first lead 106a and second lead 106b through bond wires 110. In other examples, ribbon wire, clips, other suitable interconnects, or combinations thereof may be used in place of or in combination with bond wires.

First lead 106a is on a first side 114 of semiconductor device 100. Second lead 106b is on a second side 116 of semiconductor device 100 opposite to first side 114. Encapsulation material 112 encapsulates semiconductor chip 108 and portions of lead frame 102 including die pad 104 and portions of first lead 106a and second lead 106b. Encapsulation material 112 defines first side 114 and second side 116 of semiconductor device 100. Encapsulation material 112 also defines at least two notches 119 on a third side 118 of semiconductor device 100 extending between first side 114 and second side 116. In other examples, encapsulation material 112 defines at least one notch 119 on the third side. Encapsulation 112 may also define one or more protrusions (not shown) in place of or in addition to notches 119. The at least two notches 119 and/or protrusions set a creepage distance between first lead 106a and second lead 106b to a predefined value. Accordingly, the number and/or the depth of notches 119 and/or the number and/or size of the protrusions may be set to provide the desired creepage distance.

In this example, encapsulation material 112 is free of notches on a fourth side 120 of semiconductor device 100 opposite to third side 118. In another example (not shown), encapsulation material 112 defines at least two notches on fourth side 120 of semiconductor device 100 opposite to third side 118. Third side 118 has a length indicated at 126 (FIG. 1A) and a width (i.e., height) indicated at 128 (FIG. 1B), which is less than the length. Each of the at least two notches 119 extends across the width of third side 118. In this example, notches 119 are rectangular in shape. In other examples, however, notches 119 may have another suitable shape, such as a V-shape or a rounded shape.

First side 114 and second side 116 are perpendicular to third side 118 and fourth side 120. In one example, third side 118 and fourth side 120 are perpendicular to lead frame 102. Semiconductor device 100 includes a fifth side 122 defined by encapsulation material 112 and a sixth side 124 defined by encapsulation material 112 opposite to fifth side 122.

Fifth side 122 and sixth side 124 each extend between first side 114, second side 116, third side 118, and fourth side 120 and are parallel to lead frame 102 and semiconductor chip 108. In one example, fifth side 122 and sixth side 124 are perpendicular to first side 114, second side 116, third side 118, and fourth side 120.

Figure 2A:
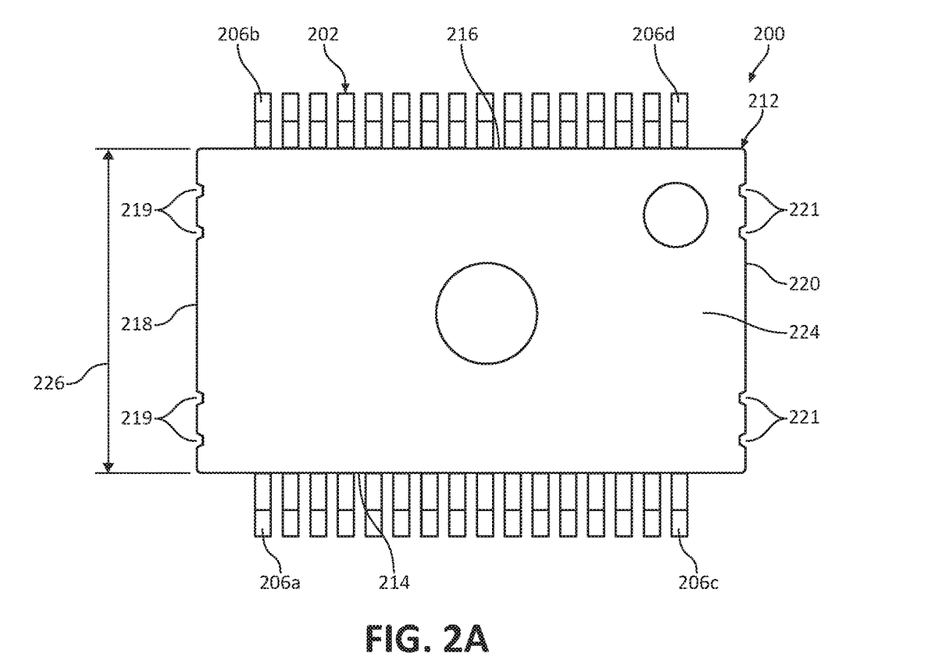
FIGS. 2A-2C illustrate another example of a semiconductor device including notches for increasing a creepage distance.
Figure 2B:
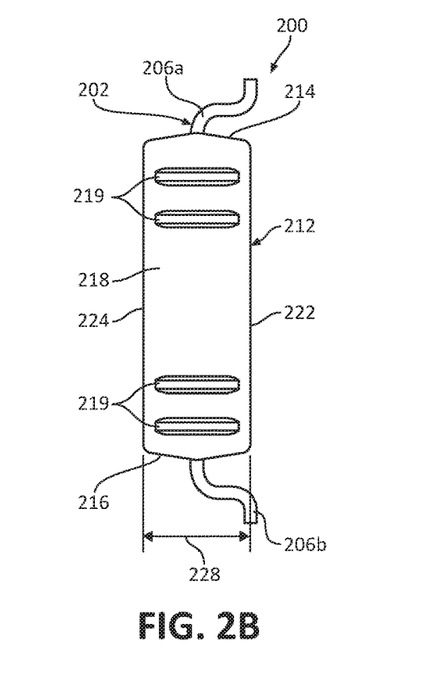
Figure 2C:
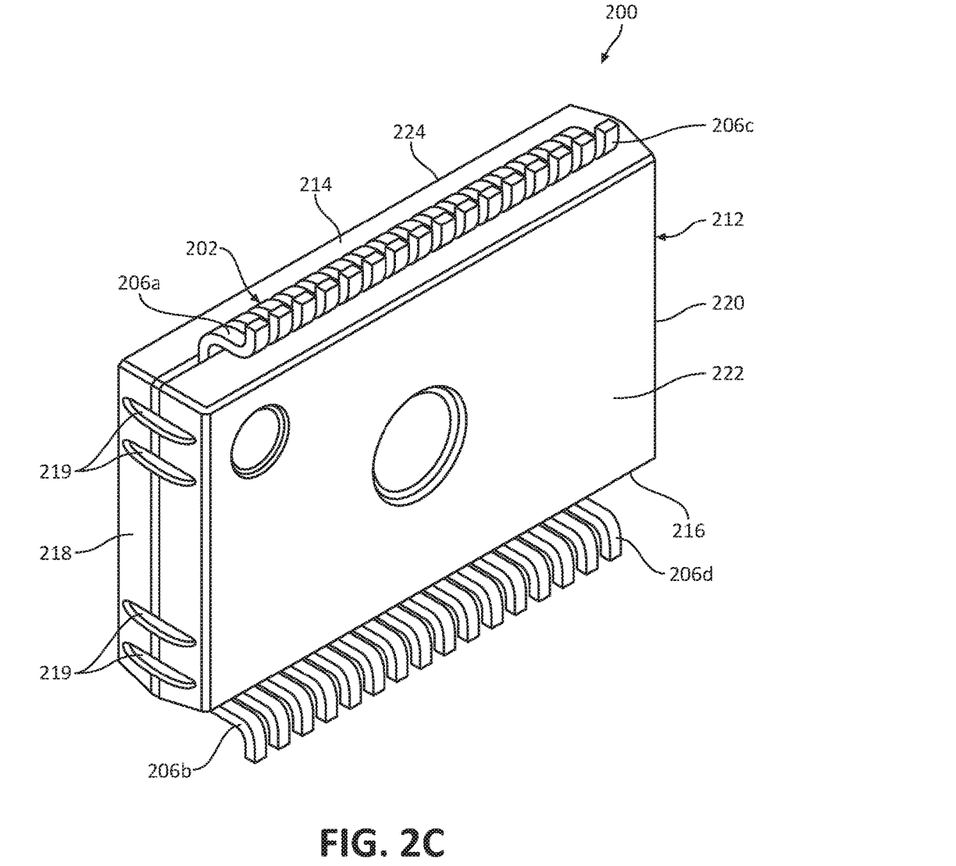

FIG. 2A illustrates a top view, FIG. 2B illustrates a side view, and FIG. 2C illustrates a perspective view of another example of a semiconductor device 200 including notches for increasing a creepage distance. Semiconductor device 200 includes a lead frame 202, a semiconductor chip (not visible), bond wires (not visible), and encapsulation material 212. Lead frame 202 includes a die pad (not visible), a plurality of first leads (i.e., contact elements) including a first lead 206a and a third lead 206c on a first side of the lead frame and a plurality of second leads including a second lead 206b and a fourth lead 206d on a second side of the lead frame opposite to the first side of the lead frame. The semiconductor chip is attached to the die pad and electrically coupled to the leads including first lead 206a, second lead 206b, third lead 206c, and fourth lead 206d through bond wires. In other examples, ribbon wire, clips, other suitable interconnects, or combinations thereof may be used in place of or in combination with bond wires.

First lead 206a and third lead 206c are on a first side 214 of semiconductor device 200. Second lead 206b and forth lead 206d are on a second side 216 of semiconductor device 200 opposite to first side 214. Encapsulation material 212 encapsulates the semiconductor chip and portions of lead frame 202 including the die pad and portions of first lead 206a, second lead 206b, third lead 206c, and fourth lead 206d. Encapsulation material 212 defines first side 214 and second side 216 of semiconductor device 200. Encapsulation material 212 also defines at least two notches 219 on a third side 218 of semiconductor device 200 extending between first side 214 and second side 216. The at least two notches 219 set a creepage distance between first lead 206a and second lead 206b to a predefined value. Encapsulation material 212 also defines at least two notches 221 on a fourth side 220 of semiconductor device 200 opposite to third side 218. The at least two notches 221 set a creepage distance between third lead 206c and fourth lead 206d to a predefined value. Accordingly, the number and/or the depth of notches 219 and 221 may be set to provide the desired creepage distances.

Third side 218 and fourth side 220 have a length indicated at 226 (FIG. 2A) and a width (i.e., height) indicated at 228 (FIG. 2B), which is less than the length. Each of the at least two notches 219 and each of the at least two notches 221 extends across the width of third side 218 and fourth side 220, respectively. In one example, third side 218 including notches 219 is a mirror image of fourth side 220 including notches 221. In this example, notches 219 and notches 221 are rounded in shape. In other examples, however, notches 219 and notches 221 may have another suitable shape, such as a rectangular shape or a V-shape.

First side 214 and second side 216 are perpendicular to third side 218 and fourth side 220. Semiconductor device 200 includes a fifth side 222 defined by encapsulation material 212 and a sixth side 224 defined by encapsulation material 212 opposite to fifth side 222. Fifth side 222 and sixth side 224 each extend between first side 214, second side 216, third side 218, and fourth side 220 and are parallel to lead frame 202 and the semiconductor chip.

Figure 3A:
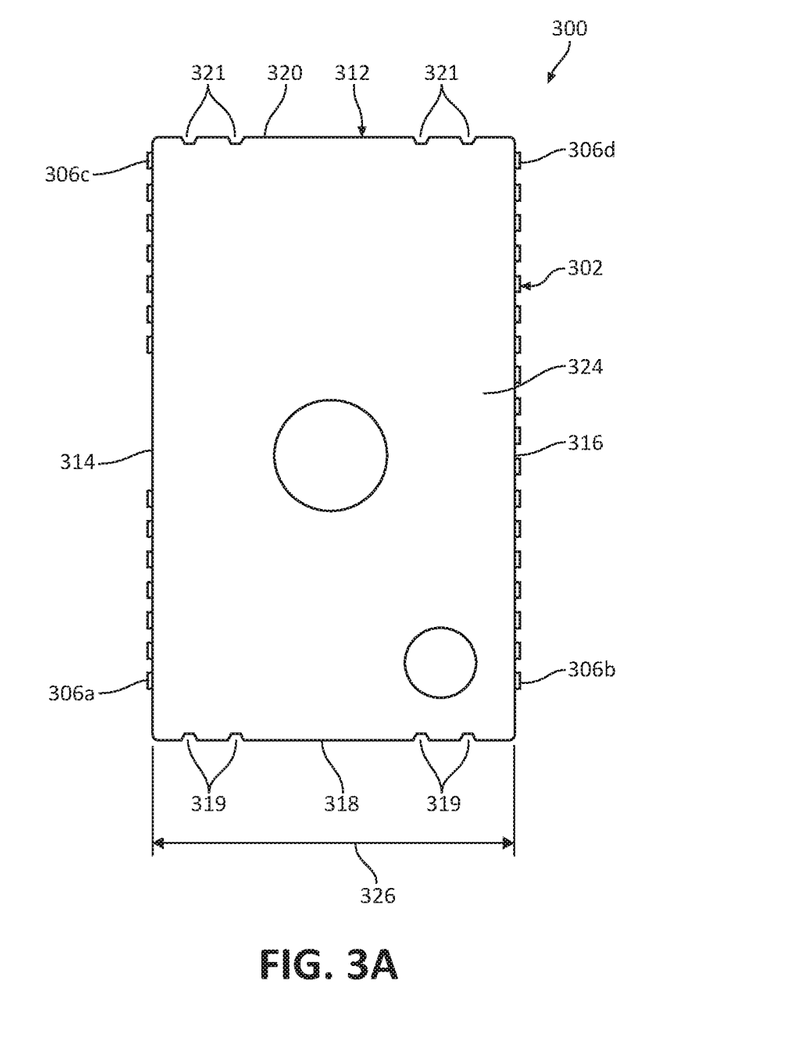
FIGS. 3A-3C illustrate another example of a semiconductor device including notches for increasing a creepage distance.
Figure 3B:
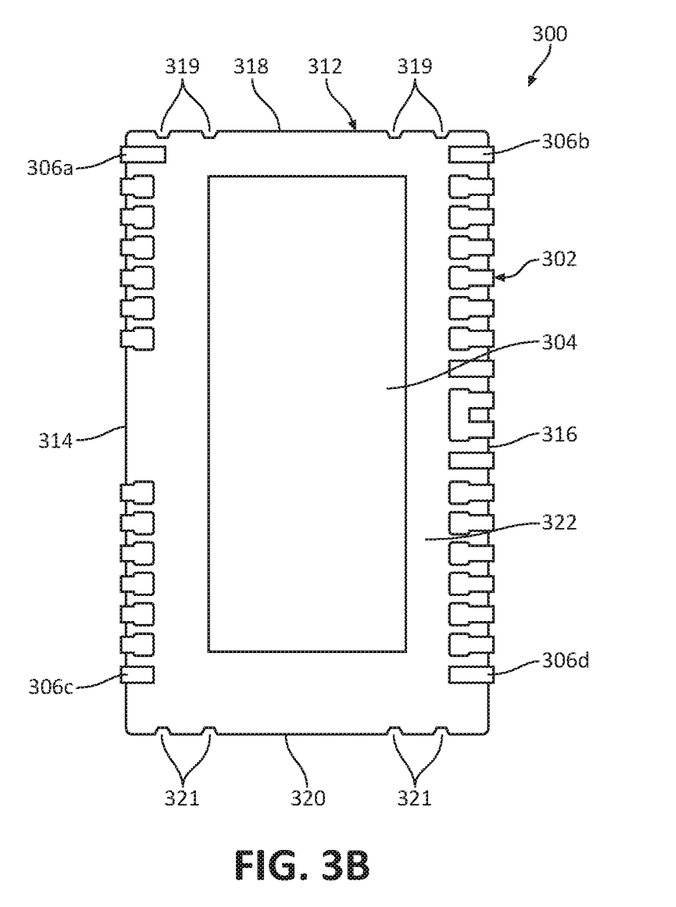
Figure 3C:
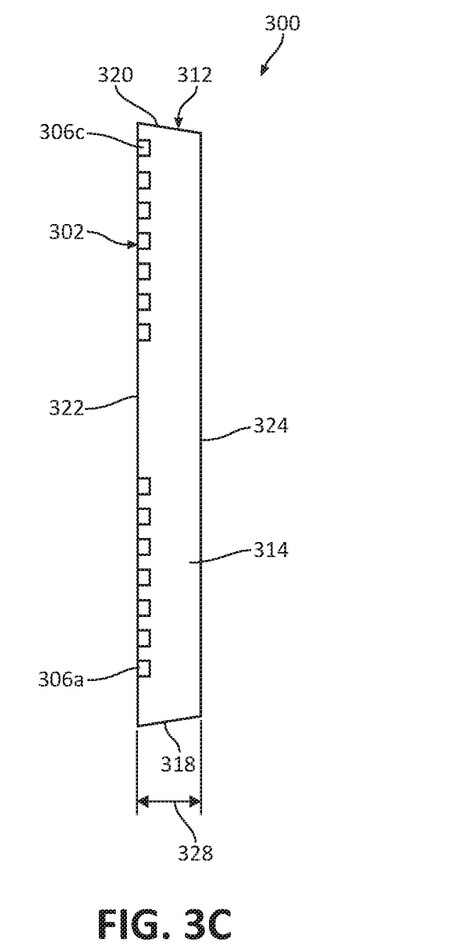

FIG. 3A illustrates a top view, FIG. 3B illustrates a bottom view, and FIG. 3C illustrates a side view of another example of a semiconductor device 300 including notches for increasing a creepage distance. In this example, semiconductor device 300 has a leadless package with an exposed die pad. Semiconductor device 300 includes a lead frame 302, a semiconductor chip (not visible), bond wires (not visible), and encapsulation material 312. Lead frame 302 includes a die pad 304, a plurality of first leads (i.e., contact elements) including a first lead 306a and a third lead 306c on a first side of the lead frame and a plurality of second leads including a second lead 306b and a fourth lead 306d on a second side of the lead frame opposite to the first side of the lead frame. The semiconductor chip is attached to die pad 304 and electrically coupled to the leads including first lead 306a, second lead 306b, third lead 306c, and fourth lead 306d through bond wires. In other examples, ribbon wire, clips, other suitable interconnects, or combinations thereof may be used in place of or in combination with bond wires.

First lead 306a and third lead 306c are on a first side 314 of semiconductor device 300. Second lead 306b and forth lead 306d are on a second side 316 of semiconductor device 300 opposite to first side 314. Encapsulation material 312 encapsulates the semiconductor chip and portions of lead frame 302 including portions of die pad 304 and portions of first lead 306a, second lead 306b, third lead 306c, and fourth lead 306d. Encapsulation material 312 defines first side 314 and second side 316 of semiconductor device 300. Encapsulation material 312 also defines at least two notches 319 on a third side 318 of semiconductor device 300 extending between first side 314 and second side 316. The at least two notches 319 set a creepage distance between first lead 306a and second lead 306b to a predefined value. Encapsulation material 312 also defines at least two notches 321 on a fourth side 320 of semiconductor device 300 opposite to third side 318. The at least two notches 321 set a creepage distance between third lead 306c and fourth lead 306d to a predefined value. Accordingly, the number and/or the depth of notches 319 and 321 may be set to provide the desired creepage distances.

Third side 318 and fourth side 320 have a length indicated at 326 (FIG. 3A) and a width (i.e., height) indicated at 328 (FIG. 3C), which is less than the length. Each of the at least two notches 319 and each of the at least two notches 321 extends across the width of third side 318 and fourth side 320, respectively. In one example, third side 318 including notches 319 is a mirror image of fourth side 320 including notches 321. In this example, notches 319 and notches 321 are rounded in shape. In other examples, however, notches 319 and notches 321 may have another suitable shape, such as a rectangular shape or a V-shape.

First side 314 and second side 316 are perpendicular to third side 318 and fourth side 320. Semiconductor device 300 includes a fifth side 322 defined by encapsulation material 312 and lead frame 302 and a sixth side 324 defined by encapsulation material 312 opposite to fifth side 322. Fifth side 322 and sixth side 324 each extend between first side 314, second side 316, third side 318, and fourth side 320 and are parallel to lead frame 302 and the semiconductor chip. A surface of die pad 304 is aligned with a surface of encapsulation material 312 on fifth side 322. A surface of each lead including first lead 306a, second lead 306b, third lead 306c, and fourth lead 306d is aligned with the surface of encapsulation material 312 on fifth side 322.

Figure 4A:
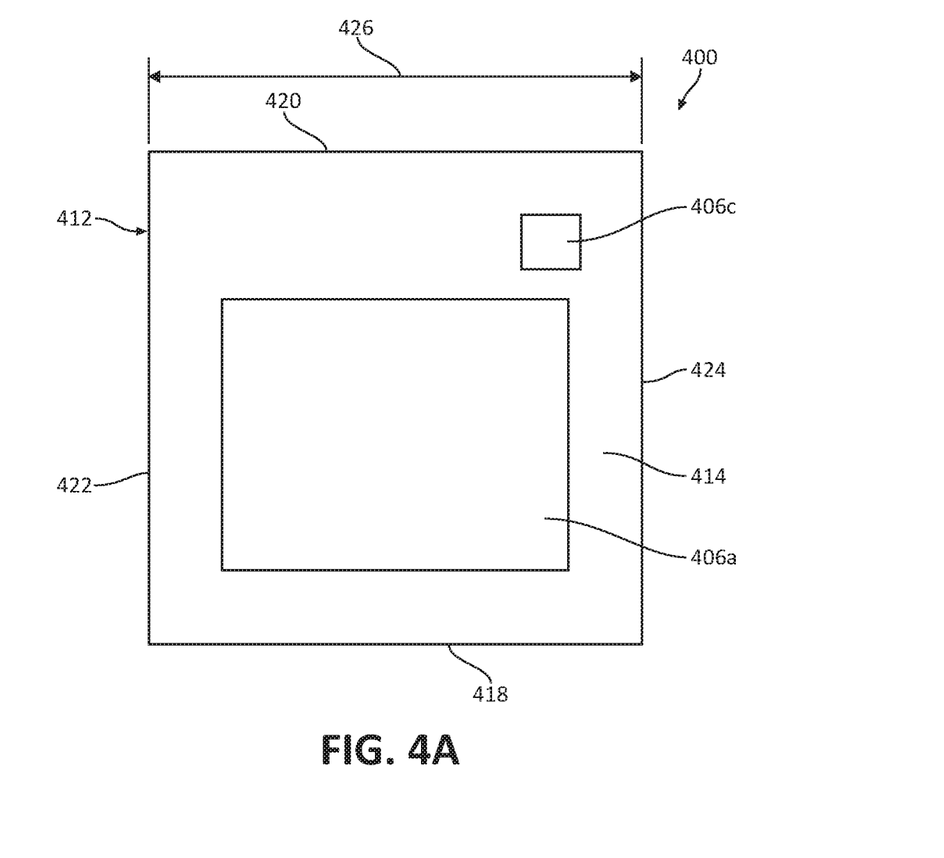
FIGS. 4A-4C illustrate another example of a semiconductor device including notches for increasing a creepage distance.
Figure 4B:
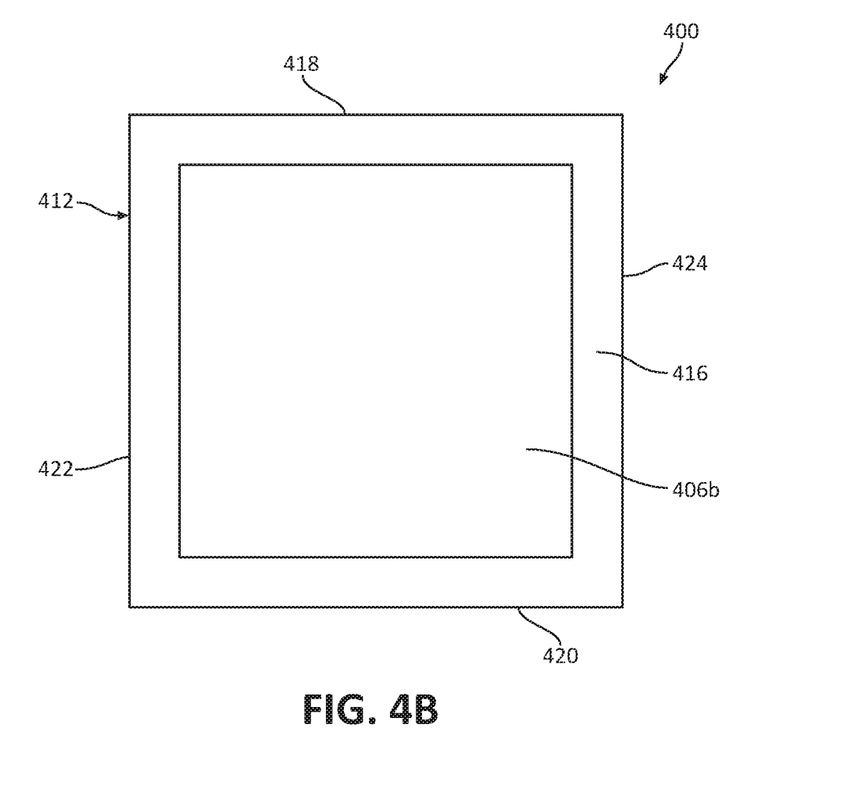
Figure 4C:
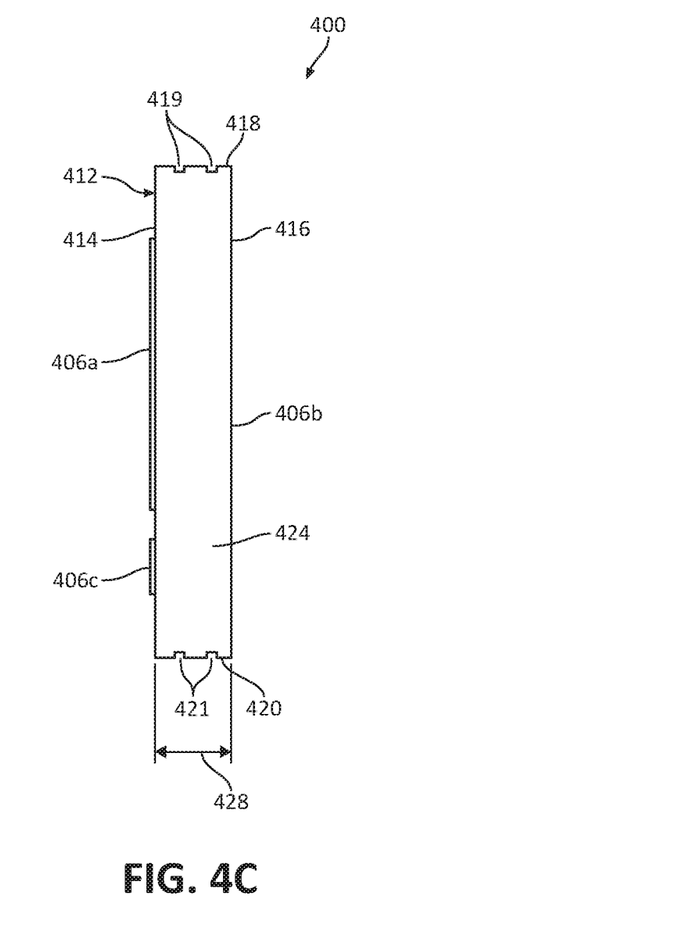

FIG. 4A illustrates a top view, FIG. 4B illustrates a bottom view, and FIG. 4C illustrates a side view of another example of a semiconductor device 400 including notches for increasing a creepage distance. In this example, semiconductor device 400 is a power transistor package. Semiconductor device 400 includes a semiconductor chip (not visible), a first contact pad 406*a* (i.e., contact element), a second contact pad 406*b*, a third contact pad 406*c*, and encapsulation material 412. The semiconductor chip is electrically coupled to first contact pad 406*a*, second contact pad 406*b*, and third contact pad 406*c*.

First contact pad 406*a* and third contact pad 406*c* are on a first side 414 of semiconductor device 400. Second contact pad 406*b* is on a second side 416 of semiconductor device 400 opposite to first side 414. Encapsulation material 412 encapsulates the semiconductor chip and portions of first contact pad 406*a*, second contact pad 406*b*, and third contact pad 406*c*. Encapsulation material 412 and contact pads 406*a* and 406*c* define first side 414, and encapsulation material 412 and contact pad 406*b* define second side 416 of semiconductor device 400. Encapsulation material 412 also defines at least two notches 419 (FIG. 4C) on a third side 418 of semiconductor device 400 extending between first side 414 and second side 416. The at least two notches 419 set a creepage distance between first contact pad 406*a* and second contact pad 406*b* to a predefined value. Encapsulation material 412 also defines at least two notches 421 (FIG. 4C) on a fourth side 420 of semiconductor device 400 opposite to third side 418. The at least two notches 421 set a creepage distance between third contact pad 406*c* and second contact pad 406*b* to a predefined value. In addition, encapsulation material 412 may define at least two notches (not shown) on a fifth side 422 of semiconductor device 400 extending between first side 414 and second side 416 and at least two notches (not shown) on a sixth side 424 of semiconductor device 400 opposite to fifth side 422. The at least two notches on fifth side 422 and the at least two notches on sixth side 424 set a creepage distance between first contact pad 406*a* and second contact pad 406*b* to a predefined value. Accordingly, the number and/or the depth of the notches on each side 418, 420, 422, and 424 may be set to provide the desired creepage distances.

Third side 418 and fourth side 420 have a length indicated at 426 (FIG. 4A) and a width (i.e., height) indicated at 428 (FIG. 4C), which is less than the length. Each of the at least two notches 419 and each of the at least two notches 421 extends across the length of third side 418 and fourth side 420, respectively. In one example, third side 418 including notches 419 is a mirror image of fourth side 420 including notches 421. In this example, notches 419 and notches 421 are rectangular in shape. In other examples, however, notches 419 and notches 421 may have another suitable shape, such as a V-shape or a rounded shape.

First side 414 and second side 416 are perpendicular to third side 418 and fourth side 420. A surface of second contact pad 406*b* is aligned with a surface of encapsulation material 412 on second side 416. In one example, first contact pad 406*a* is a source electrode of the transistor, second contact pad 406*b* is a drain electrode of the transistor, and third contact pad 406*c* is a gate electrode of the transistor.

Figure 5:
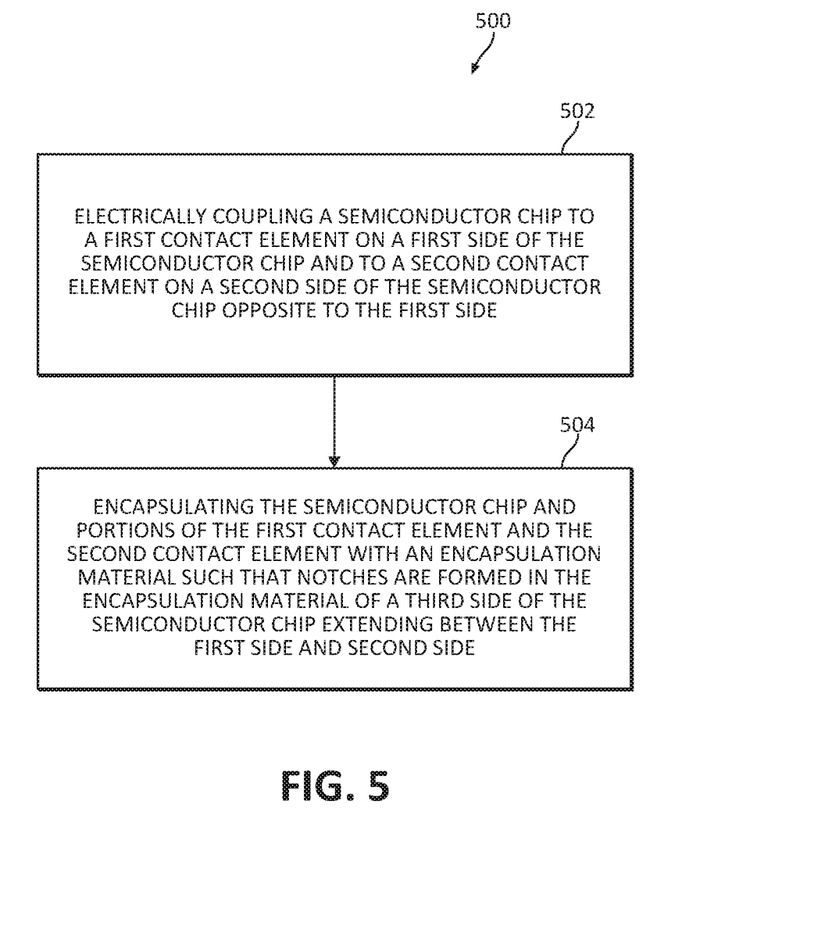
FIG. 5 is a flow diagram illustrating one example of a method for fabricating a semiconductor device including notches for increasing a creepage distance.

FIG. 5 is a flow diagram illustrating one example of a method 500 for fabricating a semiconductor device including notches for increasing a creepage distance. At 502, method 500 includes electrically coupling a semiconductor chip to a first contact element on a first side of the semiconductor chip and to a second contact element on a second side of the semiconductor chip opposite to the first side. At 504, method 500 includes encapsulating the semiconductor chip and portions of the first contact element and the second contact element with an encapsulation material such that notches are formed in the encapsulation material on a third side of the semiconductor chip extending between the first side and the second side.

In one example, the encapsulating includes encapsulating such that notches are formed in the encapsulation material on a fourth side of the semiconductor chip opposite to the third side. In one example, the first contact element includes a first lead, and the second contact element includes a second lead. In another example, the first contact element includes a first contact pad, and the second contact element includes a second contact pad.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor device comprising:
   a first contact element on a first side of the semiconductor device;
   a second contact element on a second side of the semiconductor device opposite to the first side;
   a semiconductor chip electrically coupled to the first contact element and the second contact element; and
   an encapsulation material encapsulating the semiconductor chip and portions of the first contact element and the second contact element, the encapsulation material defining at least two notches on a third side of the semiconductor device extending between the first side and the second side, the third side having a length extending between the first side and the second side and having a width perpendicular to the length, wherein the width is less than the length, wherein the at least two notches extend across the width.

2. The semiconductor device of claim 1, wherein the encapsulation material defines the at least two notches to set a creepage distance between the first contact element and the second contact element to a predefined value.

3. The semiconductor device of claim 1, wherein the encapsulation material defines at least two notches on a fourth side of the semiconductor device opposite to the third side.

4. The semiconductor device of claim 1, wherein the third side has a length and a width, the width less than the length, and
   wherein each of the at least two notches extends across the width of the third side perpendicularly to the first and second contact elements.

5. A semiconductor device comprising:
   a first contact element on a first side of the semiconductor device;
   a second contact element on a second side of the semiconductor device opposite to the first side;
   a semiconductor chip electrically coupled to the first contact element and the second contact element and
   an encapsulation material encapsulating the semiconductor chip and portions of the first contact element and the second contact element, the encapsulation material defining at least two notches on a third side of the semiconductor device and at least two notches on fourth side of the semiconductor device opposite to the third side, the third and fourth sides each free of contact elements and each having a length extending between the first side and the second side and a width perpendicular to the length, wherein the width is less than the length, and wherein each of the at least two notches extends across the lengths of the third and fourth sides.

6. The semiconductor device of claim 5, wherein the encapsulation material defines at least two notches on a fifth side of the semiconductor device extending between the first side and the second side and perpendicular to the third side, and wherein the encapsulation material defines at least two notches on a sixth side of the semiconductor device opposite to the fifth side, the fifth and sixth sides each free of contact elements.

7. The semiconductor device of claim 5, wherein the first contact element comprises a first contact pad, and wherein the second contact element comprises a second contact pad.

8. The semiconductor device of claim 7, wherein the semiconductor chip comprises a transistor, wherein the first contact pad comprises a source electrode of the transistor, and wherein the second contact pad comprises a drain electrode of the transistor.

9. A semiconductor device comprising:

a first contact element on a first side of the semiconductor device;

a second contact element on a second side of the semiconductor device opposite to the first side;

a semiconductor chip electrically coupled to the first contact element and the second contact element and an encapsulation material encapsulating the semiconductor chip and portions of the first contact element and the second contact element, the encapsulation material defining at least two notches on a third side of the semiconductor device extending between the first side and the second side, wherein the first contact element comprises a first lead of a lead frame, wherein the second contact element comprises a second lead of the lead frame, wherein the lead frame comprises a die pad having a surface aligned with a surface of the encapsulation material, wherein the first lead has a surface aligned with the surface of the encapsulation material, and wherein the second lead has a surface aligned with the surface of the encapsulation material.

10. A semiconductor device comprising:

a lead frame comprising a first lead on a first side of the semiconductor device and a second lead on a second side of the semiconductor device opposite to the first side;

a semiconductor chip electrically coupled to the lead frame; and an encapsulation material encapsulating the semiconductor chip and portions of the lead frame, the encapsulation material defining at least two notches on a third side of the semiconductor device extending between the first side and the second side, the third side and the at least two notches extending perpendicularly to a surface of a die pad of the lead frame to which the semiconductor chip is attached.

11. The semiconductor device of claim 10, wherein the encapsulation material defines the at least two notches to set a creepage distance between the first lead and the second lead to a predefined value.

12. The semiconductor device of claim 10, wherein the lead frame comprises a plurality of first leads on the first side and a plurality of second leads on the second side.

13. The semiconductor device of claim 10, wherein the encapsulation material defines at least two notches on a fourth side of the semiconductor device opposite to the third side.

14. A semiconductor device comprising:

a lead frame comprising a first lead on a first side of the semiconductor device and a second lead on a second side of the semiconductor device opposite to the first side;

a semiconductor chip electrically coupled to the lead frame; and an encapsulation material encapsulating the semiconductor chip and portions of the lead frame, the encapsulation material defining at least two notches on a third side of the semiconductor device extending between the first side and the second side, wherein the encapsulation material is free of notches on a fourth side of the semiconductor device opposite to the third side.

15. A method for fabricating a semiconductor device, the method comprising:

electrically coupling a semiconductor chip to a first contact element on a first side of the semiconductor chip and to a second contact element on a second side of the semiconductor chip opposite to the first side; and encapsulating the semiconductor chip and portions of the first contact element and the second contact element with an encapsulation material such that notches are formed in the encapsulation material on a third side of the semiconductor chip extending between the first side and the second side, the third side formed with a length extending between the first side and the second side and having a width perpendicular to the length, the width less than the length, the at least two notches extending across the width.

16. The method of claim 15, wherein the encapsulating comprises encapsulating such that notches are formed in the encapsulation material on a fourth side of the semiconductor chip opposite to the third side.

17. The method of claim 15, wherein the first contact element comprises a first lead, and wherein the second contact element comprises a second lead.

18. The method of claim 15, wherein the first contact element comprises a first contact pad, and wherein the second contact element comprises a second contact pad.

* * * * *